United States Patent [19]
Jennings

[11] Patent Number: 5,438,304
[45] Date of Patent: Aug. 1, 1995

[54] AUTOMATICALLY TUNED NOTCH FILTER FOR PROVIDING BANDPASS AND BAND REJECT SIGNALS

[76] Inventor: Peter R. Jennings, P.O. Box 336, Ben Lomond, Calif. 95005-0336

[21] Appl. No.: 952,480

[22] Filed: Sep. 25, 1992

Related U.S. Application Data

[63] Continuation of Ser. No. 630,303, Dec. 19, 1990, abandoned.

[51] Int. Cl.6 .............................................. H03H 11/4
[52] U.S. Cl. .................... 333/17.1; 333/173; 333/174; 333/176
[58] Field of Search ............ 333/17.1, 174, 176, 333/173

[56] References Cited

U.S. PATENT DOCUMENTS

| | | | |
|---|---|---|---|
| 3,287,695 | 11/1966 | Taylor | 333/174 X |
| 3,328,719 | 6/1967 | DeLisle et al. | 333/174 X |
| 3,562,675 | 1/1971 | Urell | 333/17.1 |
| 3,639,852 | 2/1972 | Boyer | 333/17.1 X |
| 4,257,018 | 3/1981 | Masdea et al. | 333/17.1 |
| 4,302,738 | 11/1981 | Cabot et al. | 333/17.1 X |
| 4,954,785 | 9/1990 | Segaram | 333/176 X |

Primary Examiner—Benny Lee
Attorney, Agent, or Firm—James E. Eakin

[57] ABSTRACT

An automatically tuned filter apparatus having as input a signal of constant or slowly varying but unknown frequency superimposed on a second signal of rapidly varying frequency with a first output attenuating the first signal by implementation of a narrow band rejection filter and the second output rejecting all but the first signal by implementation of a narrow band pass filter in which the characteristics of both filters are controlled by the relative amplitudes and phase differences of the two outputs.

10 Claims, 4 Drawing Sheets

Fig. 1

Fig. 2 Filter notch output

Fig. 3 Filter bandpass output

Fig. 4 Phase relationship $F_{clk} > F_{sig}$

Fig. 5 Phase relationship $F_{clk} < F_{sig}$ where $F_{clk}$ = clock frequency ÷ 100

AUTOMATICALLY TUNED NOTCH FILTER FOR PROVIDING BANDPASS AND BAND REJECT SIGNALS

This application is a continuation, of application Ser. No. 07/630,303, filed Dec. 19, 1990, abandoned.

BACKGROUND OF THE INVENTION

1. Field of the Invention

The invention relates to the configuration and automatic control of an audio filter designed to remove unwanted interference of a single unknown constant or slowly varying frequency from a speech signal, or other desired signal of rapidly varying frequency, and to methods and apparatuses to remove unwanted interference of rapidly varying frequency and amplitude from a desired signal of constant or slowly varying frequency.

2. Description of Prior Art

The presence of an unwanted interfering signal superimposed on an audio signal of varying frequency is a major problem in the reception of single sideband transmissions, where a constant frequency interference is the result of a continuous wave transmission on a nearby frequency. A similar form of interference can occur when data and audio signals are mixed during transmission by wire or radio. A third source of constant frequency interference is observed in the oscillation caused by unexpected audio feedback such as in a public address system.

Heretofore a wide variety of apparatuses have been proposed and implemented to remove such unwanted interference. The most common attempted solution to such interference in a single sideband receiver is the introduction of a manually tuned notch filter in the intermediate frequency section of the receiver to tune out such interference. This solution has the disadvantage of being difficult to operate and having a wider notch than the optimal width. As a result, degradation of the desired signal is noted when the notch filter is in operation. In addition, manual tuning cannot be used in the case of interference which drifts randomly in frequency.

Similarly, audio notch filters which are manually tuned have been available for some time. Such filters are difficult to use because they must be adjusted manually by the operator. The need for manual adjustment requires that the notch width be wider than the optimum frequency in order to make the tuning practical. In addition, a manually tuned audio notch filter will not track interference of a varying frequency.

A previous automatic band rejection filter disclosed in U.S. Pat. No. 3,562,675 issued to Urell is an RF filter which uses an automatically tuned bridge T filter. The method applied is only appropriate for a narrow frequency range such as the separation of LORAN signals from adjacent channel interference, and requires high precision in the selection of components for proper operation which can make manufacturing difficult.

The applicant is also aware of an automatic notch filter presently marketed in the United Kingdom by Datong Electronics Ltd. The present invention differs significantly from such filter and is not anticipated thereby.

SUMMARY OF THE INVENTION

The present invention comprises a switched capacitor active filter (SCAF) configured so as to have a notch (band rejection) output and a bandpass output with a phase relationship between the two outputs which enables a control signal to be derived therefrom which is used to adjust the operating frequency of the filter so as to make the notch and bandpass frequencies dependent upon the frequency of a constant or slowly drifting component of the input signal.

A scanning circuit enables the filter to operate over a predetermined input frequency range which is inherently wider than the locking range of the phase directed control circuit.

A control signal based on the phase relationship discussed above is used to adjust the filter's operating frequency in such a way as to attenuate an interfering signal. The summing of the control signal and scan signal serves to increase the probability of capture as the scan passes the frequency of the interfering signal.

An amplitude detection circuit compares the notch output with the bandpass output of the filter and disables the scanning operation instantly if the filter encounters a signal at the filter's operating frequency.

A short time delay after the detection of an interfering signal, the adjustment increments of the controlling signal are decreased for fine tuning and tracking of the filter's operating frequency in accordance with the frequency of the input interference. This reduces noise caused by jitter of the control signal above and below the signal frequency.

Resumption of scanning after the disappearance of the interfering signal is delayed by a predetermined time, thus maintaining attenuation of intermittent interfering signals such as morse code transmissions.

Indication of the filter operation is based on true difference in the output signals from the notch and bandpass outputs of the SCAF and is indicated by means of a 2 color LED.

Scanning noise in the output is reduced by inhibiting the scanning operation when the input signal is insufficient to operate the filter, a situation in which the ratio of the scanning noise to input signal would normally be high.

The implementation of the automatic filter may be embodied in an integrated circuit comprised of switching and amplifying elements interconnected to perform the operations discussed above.

In addition, the method of operation of the filter may embodied in the software or firmware implemented to control a digital signal processor.

LIST OF REFERENCE NUMERALS

1 Filter mechanism, implemented by a Switched capacitor active filter (SCAF).
2 Notch output signal of filter mechanism 1.
3 Bandpass output signal of filter mechanism 1.
4 Notch signal amplifier and limiter.
5 Output amplifier.
6 Bandpass signal amplifier and limiter.
7 Phase detector.
8 Time delay.
9 Integrator.
10 One shot oscillator.
11 Logical AND.
12 Notch signal amplifier and detector.
13 Voltage Controlled Oscillator (VCO).
14 Amplifier and level detector.
15 Bandpass signal amplifier and detector.
16 Voltage comparator.
17 Phase control signal input resistor for coarse tuning.
18 Phase control signal input resistor for fine tuning.
19 Scan down control signal input resistor.
20 Scan up control signal diode.
21 Analog switch controlling LED color.
22 Analog switch selecting fine/coarse tuning.
23 Analog switch selecting scan.
24 Clock signal.
25 Voltage comparator 16 output signal.
26 Voltage level detector.
27 Logical OR.
28 Summing input junction of Integrator 9.
29 Notch level signal.
30 Bandpass level signal.
31 Delayed control signal.
32 Two color LED.
33 Squared notch signal.
34 Squared bandpass signal.
35 Input signal
36 Output signal.
37 Phase detector signal.
38 Integrator output voltage.
39 Scan signal.
40 Scan again logic signal.
41 Input threshold logic signal.

DETAILED DESCRIPTION OF THE PREFERRED EMBODIMENT OF THE INVENTION

Figure 1:
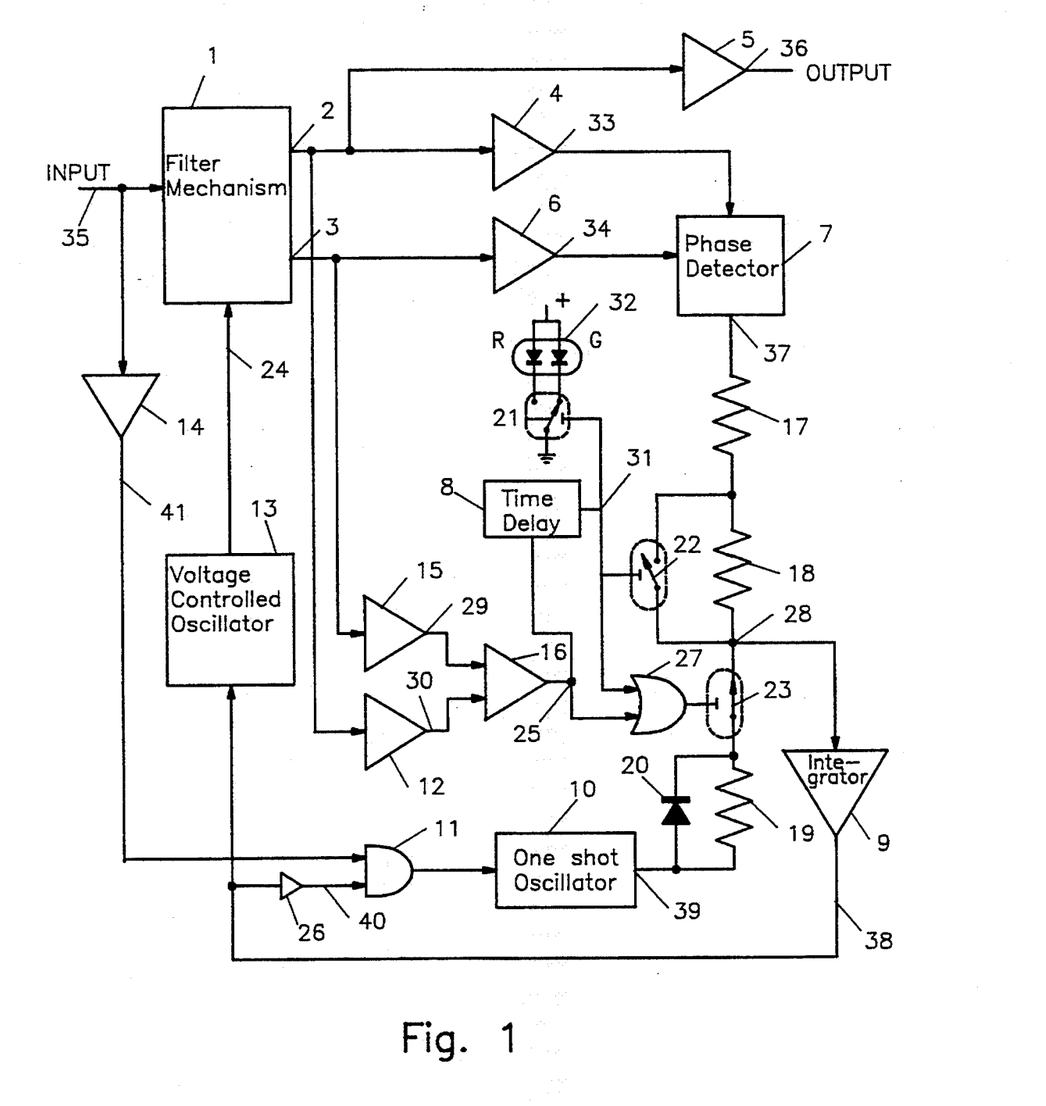
FIG. 1 shows a block diagram of the main components of the invention according to the preferred embodiment of the invention.

FIG. 1 shows a block diagram of the main components of the invention according to the preferred embodiment of the invention.

An input signal 35 comprises a desired signal component of unknown but varying frequency such as speech with a superimposed interference component of unknown but constant or slowly varying frequency such as the heterodyne produced by a continuous wave signal in a single sideband detector. Such input signal is applied to an input of a filter mechanism 1, which in the preferred embodiment comprises a commonly available switched capacitor active filter (SCAF) configured so as to have a notch (band rejection) output 2 and a bandpass output 3, each of which is a function of the frequency of a clock input signal 24. Other controllable filter mechanisms would be equally effective.

Figure 2:
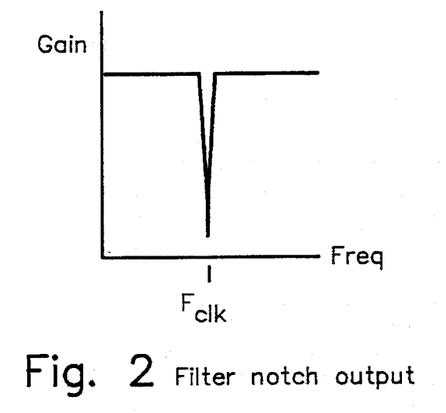
FIG. 2 shows the gain of the notch output of the filter mechanism as a function of input frequency for a given controlling clock frequency.

Referring to FIGS. 1 and 2, the gain of the filter mechanism 1 at the notch output versus the frequency of an input signal 35 for a given frequency of the clock signal 24, it can be seen that input signals at the frequency $F_{clk}$ are attenuated by the filter. $F_{clk}$ is a function of the frequency of the clock signal 24. In the preferred embodiment of the invention, the switched capacitor active filter is configured such that the frequency $F_{clk}$ is equal to 0.010 times the frequency of the clock signal.

Figure 3:
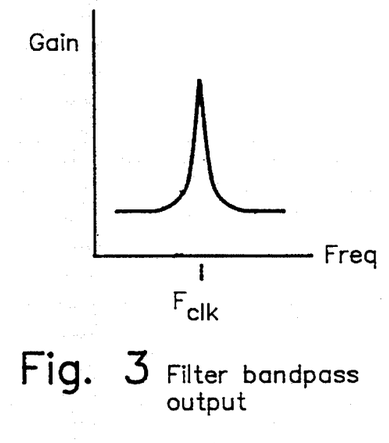
FIG. 3 shows the gain of the bandpass output of the filter mechanism as a function of input frequency for a given controlling clock frequency.

Referring to FIGS. 1 and 3, the gain of the filter mechanism 1 at the bandpass output versus the frequency of an input signal 35 for a given clock frequency, it can be seen that input signals at frequencies not equal to the frequency $F_{clk}$ are significantly attenuated, and that signals at the frequency $F_{clk}$ are not attenuated, and may in some configurations be amplified by the filter mechanism.

When the frequency of the clock signal 24 controlling the filter mechanism is adjusted such that $F_{clk}$ is equal to the frequency of the interference component of an input signal 35, the notch output signal 2 from the notch output of the filter will consist of mainly the desired rapidly varying component of the input signal with the slowly varying interfering component of the input signal highly attenuated. The notch output signal 2 is amplified by output amplifier 5 to produce the final output signal 36. A suitable clock signal 24 which will lock on to the interfering signal and track it through slow variations in frequency and amplitude despite the presence of the desired component of the input signal in varying frequency and amplitude is generated by the control circuit discussed below.

Figure 4:
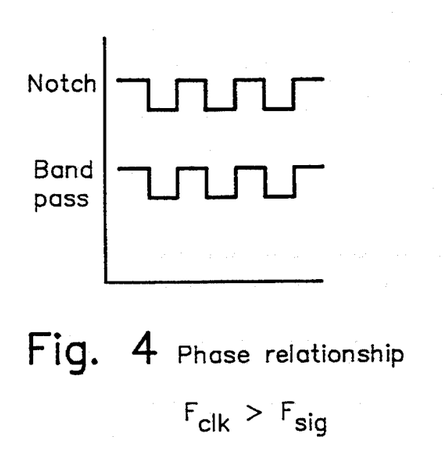
FIG. 4 shows the phase relationship between the notch output of the filter mechanism and the bandpass output of the filter mechanism for the case in which the control frequency is higher than the input frequency.
Figure 5:
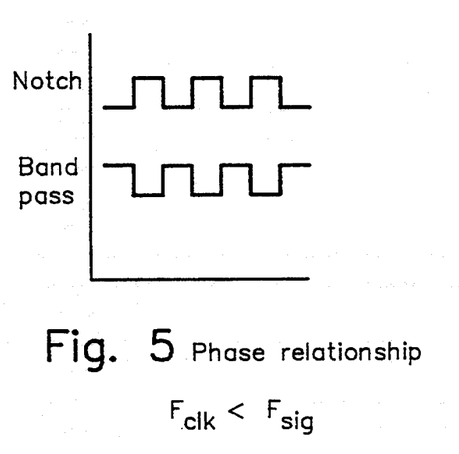
FIG. 5 shows the phase relationship between the notch output of the filter mechanism and the bandpass output of the filter mechanism for the case in which the control frequency is lower than the input frequency.

Referring to FIGS. 1 and 4, the phase relationship of the notch output signal 2 of the filter mechanism and the bandpass output signal 3 of the filter mechanism after the signals are amplified and limited by notch signal amplifier and limiter 4 and bandpass signal amplifier and limiter 6 to produce a squared notch signal 33 and a squared bandpass signal 34, it can be seen that if the input signal is lower in frequency than the frequency $F_{clk}$ the notch output and the bandpass output signals will be in phase. Referring to FIG. 5, the relationship of the signals when the input signal is of higher frequency than the frequency $F_{clk}$, the notch output signal 33 and the bandpass output signal 34 will be relatively 180° out of phase.

The phase relationship between the squared notch signal 33 and squared bandpass signal 34 applied to phase detector 7 generate phase detector signal 37 which is a function of the error of $F_{clk}$ in tracking a constant frequency component of the input signal. This control signal will be valid when $F_{clk}$ is near to the frequency of the input signal.

The phase detector signal 37 is applied via phase control signal input resistor for coarse tuning 17 in series with phase control signal input resistor for fine tuning 18 to summing input junction 28 of integrator 9.

The integrator output voltage 38 of integrator 9 is used to control the frequency of voltage controlled oscillator 13. The output clock signal 24 of the voltage controlled oscillator is the clocking signal for the filter mechanism 1. $F_{clk}$, the notch and bandpass frequency of the filter mechanism 1 is a function of the frequency of clock signal 24.

At input frequencies much higher, or much lower than the frequency $F_{clk}$, the bandpass output is greatly attenuated. The exact frequency difference at which this is a problem depends upon the Q parameter of the filter mechanism used. Since the bandpass output is attenuated, there is insufficient signal to operate the phase detector reliably and hence phase detector signal 37 no longer depends upon the difference between the input signal and $F_{clk}$. To extend the capture frequency range of the invention, a method of scanning the clock frequency, and hence the derivative operating frequency of the filter $F_{clk}$ through a range of frequencies is incorporated. The exact range of frequencies scanned can be controlled by varying the parameters of the voltage controlled oscillator 13.

Initially, the output scan signal 39 of the one shot oscillator 10 is low. This signal is applied to the summing input junction 28 of integrator 9 via resistor 19 through normally closed analog switch 23 which causes the integrator output voltage 38 of integrator 9 to drift downwards.

When the integrator output voltage 38 reaches a level set by voltage level detector 26 the scan again logic signal 40 changes to true, indicating that the bottom range of the scan frequency has been reached and it is time to scan again.

Amplifier and level detector 14 provide a logic output related to the amplitude of the input signal 35. If the input signal is above a predetermined threshold amplitude, the input threshold logic signal 41 from the detector will be true. Logical AND 11 provides a triggering signal for the one shot oscillator 10 if there is an input signal 35 greater than the desired threshold AND if the integrator output voltage 38 is below the preset level for the scanning range. This mechanism inhibits the scanning function when there is no input signal of sufficient magnitude to operate the system in order to provide a clean output signal free of scanning noise when there is only a low level signal input and ensures a complete scan of the entire frequency range with a scan time dependent upon the number of times the scan stops at potential interference signals.

The lower bound of the frequency scan is set by the trigger voltage of the voltage level detector 26. The upper bound of the frequency scan is determined by the length of the pulse output by the one shot oscillator 10 and the gain of the integrator 9 and conducting resistance of the scan up control signal diode 20.

In the preferred implementation, there is a rapid scan from low to high frequency as determined by scan up control diode 20, and a slow scan from high to low frequency with a rate determined by scan down control resistor 19. Modifying the value of the scan down control resistor 19 or adding a resistor in series with the scan up control diode 20 allows full control of the scan characteristics.

The notch output signal 2 is also applied to the input of notch signal amplifier and detector 12 which provides a time average DC notch level signal 29 proportional to the power of the notch output signal 2. Similarly, the bandpass output signal 3 is applied to the bandpass signal amplifier and detector 15 which provides a time average DC bandpass level signal 30 proportional to the power of the bandpass output signal 3. The signals 29 and 30 are compared by voltage comparator 16. The voltage comparator output signal 25 of comparator 16 will reflect the power difference between the notch output signal 2 and the bandpass output signal 3. As can be seen in FIG. 2, when the clock signal 24 is tuned such that the frequency $F_{clk}$ is near to the frequency of a component of the input signal the bandpass output will exceed the notch output causing the voltage comparator 16 output to switch from false to true.

When the voltage comparator output signal 25 is true, indicating that the filter has found an input signal near the frequency $F_{clk}$, the scan control signal otherwise applied to the integrator 9 via scan down control resistor 19, is disconnected by the opening of normally closed analog switch 23 controlled by the output from voltage comparator 16 through Logical OR 27. The frequency of the voltage controlled oscillator 13 will depend only on the output of integrator 9 as controlled by the phase detector signal 37. The error control signal from the phase detector will tend to move the voltage controlled oscillator frequency to the point at which $F_{clk}$ is equal to the input frequency.

After $F_{clk}$ has reached equality with the input frequency, random perturbations will cause the phase detector output to vary from positive to negative causing fluctuations in the clock frequency above and below the desired tracking frequency. The magnitude of these fluctuations is reduced a short time after the signal is found by increasing the resistance of the integrator input from the phase detector. This is effected by the time delay 8 opening normally closed analog switch selecting fine/coarse tuning 22 thus placing phase control input resistor for fine tuning 18 in series with phase control input resistor for coarse tuning 17 between the phase detector output and the integrator input. The result is a short period of coarse tuning of the frequency determined by the value of resistor 17 following signal capture followed by continuous fine tuning determined by the value of the sum of resistor 17 and resistor 18 until the signal is no longer present.

When the interfering signal disappears, the voltage comparator output signal 25 from the voltage comparator 16 goes false. After a predetermined time, the delayed control signal 31 from the time delay 8 will also go false and the control signal of analog switch 23 which is the Logical OR of signals 31 and 25 will go false allowing switch 23 to close connecting the scan signal to the integrator 9 and causing the VCO frequency to scan. Switch 22 also closes at this time and the effect of the phase detector signal 37 is increased. This increase creates a wider capture range as the clock frequency is scanned near the frequency of the interfering signal because the phase detector signal 37 will tend to adjust the VCO in such a way as to make $F_{clk}$ equal to the input signal frequency.

Delayed control signal 31, which indicates that the filter has effectively reduced the amplitude of a component of the input signal for a period equal to or longer than the time determined by delay circuit 8, is used to control switch 21 which switches two color LED 32 from green to red to indicate to the operator that the filter is locked to an input interfering signal.

Figure 6:
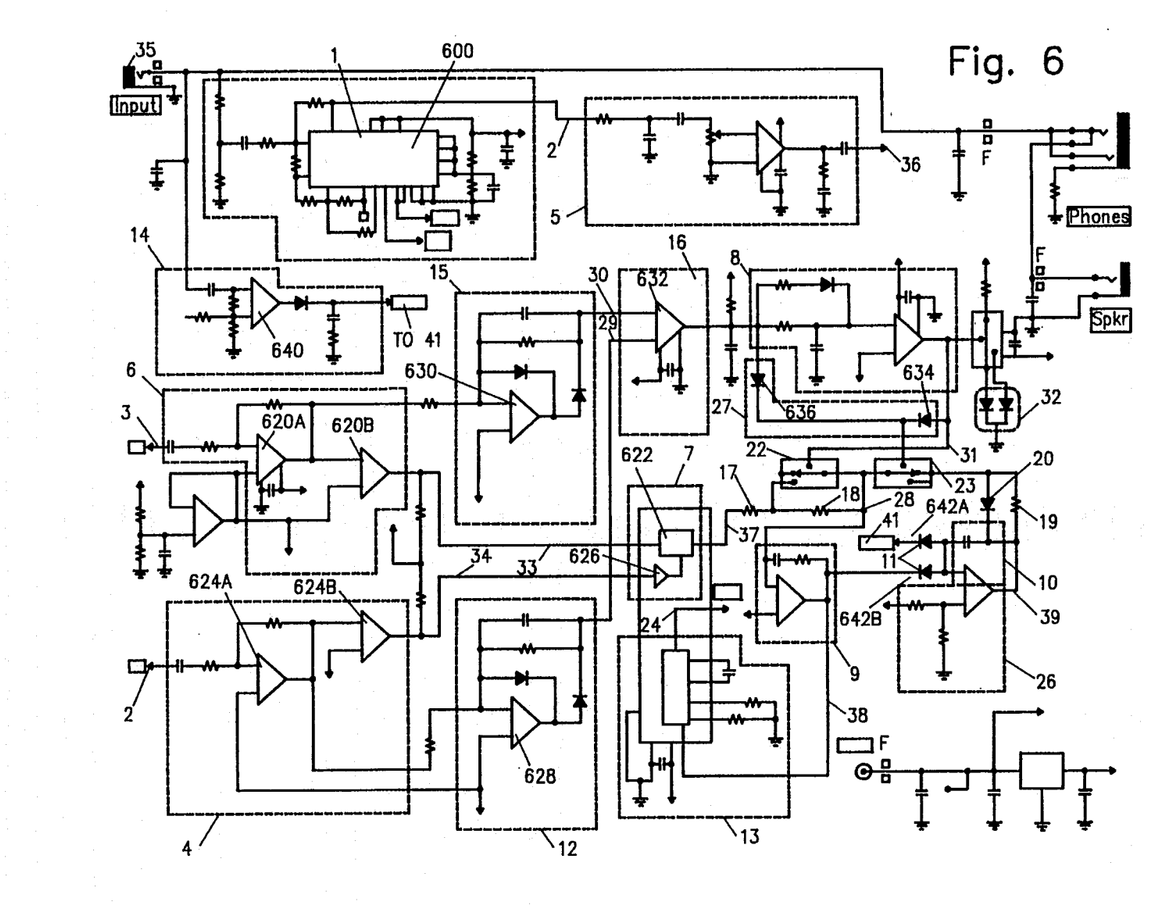
FIG. 6 shows the schematic of the preferred embodiment of the invention.

Reference is now made to FIG. 6, which shows in schematic detail the filter of FIG. 1, whereas FIG. 1 is shown in block diagram form. The input signal 35 is supplied to a filter mechanism which performs the functions of filter mechanism 1 of FIG. 1, comprised of a universal monolithic dual switched capacitor filter 600, typically an MF10CCN filter available from National Semiconductor, together with related circuitry for configuring the filter 600 so that its characteristic operating frequency is 0.01 times the frequency of the clock input signal 24, all as described in the National Semiconductor Corporation Linear Databook 2, pp. 1–81. Additionally, the filter has a bandpass output signal 3 and a notch (band stop) output signal 2 with a filter characteristic Q on the order of 10.

The notch output signal 2 is coupled in a conventional manner to an output amplifier circuit which performs the functions of output amplifier circuit 5 of FIG. 1, comprised of op amp 380 together with conventional biasing circuitry. The output amplifier circuit (5) provides an output signal 36.

In addition, the notch output signal 2 is also coupled to a notch signal amplifier and limiter like the similar circuit 4 of FIG. 1, comprised of a pair of amplifiers 620A, 620B, that produces a squared notch output signal on the line 33, which in turn is coupled to one input of the phase detector 7 (as in FIG. 1), comprising PC 622. The bandpass output signal 3 is coupled to bandpass signal amplifier and detector (as with amplifier and detector 6 of FIG. 1), comprised of a pair of amplifiers 624A, 624B, which produces a squared bandpass output signal 34 and provides a second input to the phase detector 7 through an inverter 626.

The notch output output signal 2 also is coupled to a notch signal amplifier and detector circuit (as with notch signal amplifier and detector 12 of FIG. 1), comprising amplifier 628 and associated feedback circuitry, which produces a DC notch level signal 30 proportional to the power of the notch output signal 2. The bandpass output signal 3 is similarly coupled to a bandpass signal amplifier and detector circuit (see bandpass amplifier and detector 15, FIG. 1), comprising amplifier 630 and associated feedback circuitry similar to amplifier 628, which produces a bandpass level signal 29 proportional to the power of the bandpass output signal 3. Amplifiers 628 and 630 may be type 324 or equivalent.

Notch level signal 29 and bandpass level signal 30 are compared by comparator circuit (see comparator 16, FIG. 1), which comprises an amplifier/comparator 632 typically of type 339. The comparator 16 provides a logically true output signal at line 25 when the bandpass output signal 3 is stronger than notch output signal 2. Line 25 is coupled to a logical OR circuit 27 (FIG. 1), comprising diodes 634 and 636, the output of which is used to turn off the analog switch selecting scan 23. The output signal on line 25 is also coupled to time delay 8 (FIG. 1), which comprises another amplifier 638 typically of type 324 with appropriate biasing circuitry, and the output thereof is a delayed control signal on line 31. The delayed control signal is connected to analog switch 21, used to change the display color of two color LED 32, and to switch the state Of analog switch 22 selecting fine or coarse tuning.

Input signal 35 is also coupled to amplifier and level detector 14 (FIG. 1), comprised of another amplifier 640 also typically a type 324, the output of which is an input threshold logic signal 41 proportional to the power of the input signal. The signal 41 is AND'ed with the output voltage of integrator 38 by means of an AND gate 41 formed of diodes 642A, 642B. The result is applied to a voltage level detector 26 and one shot 10, functionally formed in the same circuit using IC4d, to produce scan signal 39 when the notch output signal 2 is sufficient and the output voltage of integrator 38 has reached the end of the previous scan.

Scan signal 39 is coupled directionally to analog selecting scan switch 23 by means of scan up control signal diode 20 and scan down control signal input resistor 19. The output of the switch 23 is applied to summing input junction 28 of integrator 9.

The output of phase detector 7 is supplied on line 37 to a resistor 17 for coarse tuning and then to a summing junction 28 either through switch 22 or a fine tuning resistor 18, depending on the state of the switch 22. The output of the summing junction 28 provides the input to the integrator 9. The integrator output voltage 38 is supplied to voltage controlled oscillator 13, to control the frequency thereof. The output of VCO 13 controls the operation of filter 1.

It will be appreciated by those skilled in the art that various elements of FIG. 6 such as jacks, bypass capacitors, pull-up resistors, and power supply components, while shown, have not been specifically identified since their use and operation is believed well understood given the above teachings.

Figure 7:
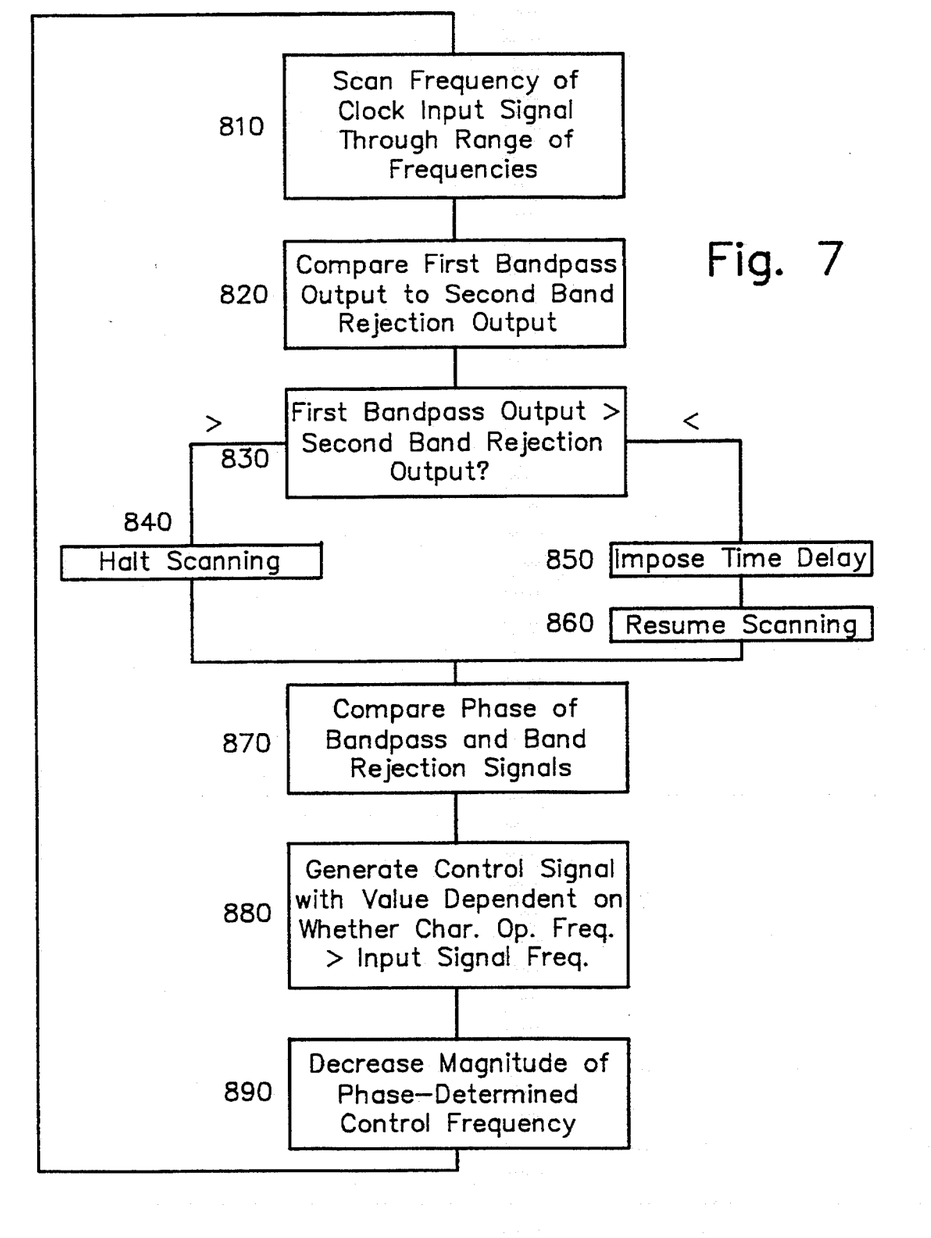
FIG. 7 shows in flow diagram form a method for automatically controlling a filter mechanism according to the present invention.

Referring next to FIG. 7, a method for automatically controlling a filter mechanism according to the present invention is shown in flow diagram form. The method includes the steps of scanning at step 810 the frequency of a clock input signal through a range of frequencies, comparing at step 820 the relative power of the signals present at a first bandpass output terminal and a second band rejection output terminal of a filter mechanism, generating at step 830 a control signal which is true when the output of the bandpass output terminal exceeds the output of the band rejection terminal, halting or blocking scanning at step 840 when the control signal is true, or resuming scanning at step 860, after a time delay imposed at step 850, when the control signal is false. Additionally, the relative phase of the bandpass and band rejection signals may be compared, as shown at step 870, and a control signal generated at step 880 which has one value if the characteristic operating frequency of the filter is below the input signal frequency and a different value is the characteristic operating frequency of the filter is above the input signal frequency. After a suitable delay, the magnitude of the phase-determined control frequency can be decreased, as shown at step 890, after scanning has stopped.

It is apparent that in certain instances there may be more than one interfering signal present. Multiple implementations of the invention may be placed in series in such a way as to remove multiple interfering signals from the desired signal.

The definition of wanted signal and interfering signal is somewhat arbitrary. It is recognized that the filter as described is equally useful as a narrow bandwidth band pass filter for removing unwanted broadband interference from a desired signal of narrow bandwidth. In this case, the output amplifier 5 would be connected to the bandpass output signal 3 instead of the notch output signal 2.

While the above description contains many specificities, these should not be construed as limitations on the scope of the invention but merely as exemplifications of the preferred embodiment thereof. Those skilled in the art will envision many other embodiments of the described preferred embodiment of a process of controlling such a filter mechanism, wherein the filter mechanism has a band pass output and a band rejection output. This process consists of scanning the filter mechanism through a range of frequencies while comparing the band pass output of the filter mechanism with the band rejection output of the filter mechanism. When the power of the band pass output signal exceeds the power of the band rejection output signal, indicating that the filter has encountered an input signal on or near the characteristic operating frequency of the filter, a logic control signal is generated which is used to halt or block the scanning process until a fixed period of time after the logic control signal indicates that the input signal has disappeared. Simultaneously, the phase differences between the band pass output and band rejection output are used to generate a control signal which is indicative of the sign of the difference between the input frequency and the filter's characteristic operating frequency. This control signal is summed with the scanning signal to adjust the frequency of the clock input signal which controls the characteristic frequency of the filter toward the frequency of the interfering signal. A short time after the scanning is stopped, as described above, the magnitude of the control pulses generated by the phase difference is reduced in order to maintain a smaller deviation of the filter around the frequency of the input signal.

It is anticipated that method of the control mechanism described above could be encoded in software or firmware and used to control the operation of a digital signal processor in such a way as to bring about the same results. In such a case, the amplitude and phase comparisons described are represented as numerical values in the registers or memory of such a processor, and the gain of the filter at each frequency is controlled by a program, the implementation of which is a representation of the process described above.

It is also anticipated that the amplification and switching devices used in the preferred embodiment could be incorporated into one or more integrated circuits.

I claim:

1. An automatically tuned notch filter having at least one characteristic operating frequency for rejecting at least one narrow band interference signal comprising:
   a voltage controlled oscillator for providing a clock input signal having a frequency dependent upon a control voltage applied thereto,
   a filter mechanism, operatively coupled to the voltage controlled oscillator for receiving said control signal, having an input terminal coupled to receive an input signal with a frequency and having first and second output terminals for providing, respectively, band rejection and bandpass signals at a frequency controlled by the clock input signal, said band rejection and bandpass signals each having a corresponding amplitude,
   said filter mechanism having a phase relationship between the band rejection and bandpass signals such that a phase difference occurs between said band rejection and band pass signals which is a function of the difference between the input signal frequency and the characteristic operating frequency of the filter, said characteristic operating frequency is determined by a signal characteristic of said clock input signal, and
   means responsive to the band rejection and bandpass signals for generating a first control signal representative of the relative phase between the band rejection and bandpass signals, and
   means responsive to the band rejection and bandpass signals for generating a second control signal representative of the relative amplitudes of the band rejection and bandpass signals, and
   means operatively connected to the control signal means for coupling the first and second control signals as the control voltage to the voltage controlled oscillator.

2. The apparatus of claim 1 wherein said filter mechanism further comprises a switched capacitor active filter.

3. The apparatus of claim 1 wherein said means for generating a first control signal representative of the relative phase between the band rejection and bandpass signals includes means for amplifying the band rejection and bandpass signals and means for limiting such signals so as to produce square wave signals which are coupled to a phase detector.

4. The apparatus of claim 1 wherein said means for generating a second control signal representative of the relative amplitude between the band rejection and bandpass signals includes means for amplifying the band rejection and bandpass signals and means for coupling said amplified signals to detectors having a fixed time constant, the detectors providing outputs which are voltages dependent upon a time averaged power level of the signals which are compared by a voltage comparator.

5. The apparatus of claim 1 wherein said means for coupling the first and second control signals to the voltage controlled oscillator comprises means for coupling said first and second control signals to an integrator with two summed inputs, each of said first and second control signals being connected to a respective one of said two summed inputs.

6. The apparatus of claim 1 wherein an operation of said filter in rejecting a narrow band interference signal is indicated by an alteration in color of an LED display device coupled to said second control signals representative of the relative amplitudes of the bandpass and band rejection signals.

7. The apparatus of claim 1 wherein the coupling of the voltage controlled oscillator to a one shot oscillator enables the clock input signal to perform a scan operation which scans through a range of frequencies when the control voltage of said voltage controlled oscillator is below a predetermined voltage.

8. A process of automatically controlling a filter mechanism having an input terminal coupled to receive an input signal and having a first output terminal and a second output terminal respectively providing for band rejection and band pass signals at a frequency determined by a clock input signal, comprising the steps of
   scanning a frequency of said clock input signal through a range of frequencies,
   comparing a relative power of the signals present at a first bandpass output terminal and second band rejection output terminal of the filter mechanism for each of the scanned frequencies,
   generating a control signal which is TRUE when said output at the first band pass terminal exceeds said output at the second band rejection terminal,
   halting or blocking scanning when said control signal is TRUE, and
   resuming scanning when said control signal is not TRUE.

9. The process of claim 8 wherein said resuming of said scanning is delayed by a fixed period of time.

10. The process of claim 8 wherein said filter mechanism has a characteristic operating frequency with a phase relationship between said first and second output terminals such that a phase difference between such signals is a function of a difference between an input signal frequency and a characteristic operating frequency of said filter as determined by a signal characteristic of said clock input signal, further comprising the steps of comparing a relative phase of signals present at said first and second output terminals of said filter mechanism, and generating a second control signal which has a given value if the characteristic operating frequency of said filter is below an actual frequency of an input signal, and a different value if said characteristic operating frequency of said filter is above an actual frequency of said input signal, and modifying said characteristic operating frequency of said filter mechanism by causing said control signal to effect a change in frequency of a clock input signal to the filter.

* * * * *